United States Patent
Beverina et al.

[11] Patent Number: 5,926,416
[45] Date of Patent: *Jul. 20, 1999

[54] ELECTRICALLY PROGRAMMABLE NON-VOLATILE MEMORY CELLS DEVICE FOR A REDUCED NUMBER OF PROGRAMMING CYCLES

[75] Inventors: Bruno Beverina, Merate; Paolo Cappelletti, Seveso; Roberto Gastaldi, Agrate Brianza, all of Italy

[73] Assignee: SGS - Thomson Microelectronics S.r.l., Milan, Italy

[ * ] Notice: This patent issued on a continued prosecution application filed under 37 CFR 1.53(d), and is subject to the twenty year patent term provisions of 35 U.S.C. 154(a)(2).

[21] Appl. No.: 08/807,574

[22] Filed: Feb. 27, 1997

[30] Foreign Application Priority Data

Feb. 29, 1996 [EP] European Pat. Off. ............ 9680088

[51] Int. Cl.⁶ .................................................. G11C 16/04
[52] U.S. Cl. .............................. 365/185.18; 365/185.28; 365/185.29
[58] Field of Search .................... 365/185.18, 185.29, 365/185.28

[56] References Cited

U.S. PATENT DOCUMENTS

| | | | |
|---|---|---|---|
| 4,794,433 | 12/1988 | Kamiya et al. | 257/321 |
| 4,797,856 | 1/1989 | Lee et al. | 365/185.3 |
| 5,199,001 | 3/1993 | Tzeng | 365/185.33 |
| 5,390,146 | 2/1995 | Atwood et al. | 365/185.02 |
| 5,392,253 | 2/1995 | Atsumi et al. | 365/230.06 |
| 5,427,963 | 6/1995 | Richart et al. | 438/257 |
| 5,530,675 | 6/1996 | Hu | 365/218 |
| 5,612,913 | 3/1997 | Cappelletti et al. | 365/185.12 |

FOREIGN PATENT DOCUMENTS

| | | | |
|---|---|---|---|
| 0 520 505 A2 | 6/1992 | European Pat. Off. | G11C 11/401 |
| WO 95/07535 | 9/1994 | WIPO | G11C 13/00 |

*Primary Examiner*—David Nelms
*Assistant Examiner*—Hoai V. Ho
*Attorney, Agent, or Firm*—Allen, Dyer, Doppelt, Milbrath & Gilchrist, P.A.

[57] ABSTRACT

A device incorporating electrically programmable nonvolatile memory cells for a small number of programming cycles, in which an individual cell is impressed, both during the write step and the erase step, a bias condition such that a charge flow can only occur between the drain region and the gate dielectric, and vice versa.

11 Claims, 2 Drawing Sheets

2

ELECTRICALLY PROGRAMMABLE NON-VOLATILE MEMORY CELLS DEVICE FOR A REDUCED NUMBER OF PROGRAMMING CYCLES

FIELD OF THE INVENTION

The present invention relates to monolithically integrated devices incorporating non-volatile memory cells, and, more particularly, electrically programmable non-volatile memory cells.

BACKGROUND OF THE INVENTION

From the aspect of cost versus flexibility, the market for non-volatile memory cell devices can be divided into three major sections, as follows. A first section covers the so-called MASK ROM products, which are low in cost, but also low in flexibility of application since the information loaded into the memory cells cannot be modified later.

The second section covers the EPROM and OTP products, whose cost is significantly higher than that of the ROM products, but whose flexibility is much higher in that they can be programmed by the customer. EPROM products are encapsulated into packages having a transparent lens to radiation whereby the memory cells can be erased, since the cells are responsive to that radiation. This is not feasible with OTP products after they have been programmed and packaged. Furthermore, EPROM products require that their packages be disconnected from the rest of the system, before they can be erased.

The third major section covers the so-called FLASH products, whose memory cells can be modified electrically for a large number of times, thereby affording enhanced flexibility. However, this very flexibility encourages manufacturers to plan ever more complex functions for the devices, thereby facing increased costs which are bound to be high compared to those of the other products.

There are applications, however, which demand a large number of functions of the device, as well as high performance, along with ease of programming. The latter being a feature which is seldom necessary or only occasionally put to use over the device lifespan.

SUMMARY OF THE INVENTION

The underlying technical problem of the present invention is to provide a device with a novel memory cell architecture which allows of re-programming as readily as conventional FLASH products, albeit for a limited (yet sufficient for particular applications) number of times without depressing the device potential for operations, and this at a much reduced cost.

These and other objects, features and advantages of the present invention are provided by a monolithically integrated device comprising(: electrically programmable non-volatile memory cells, each having at least first and second terminals and a control terminal which are used for selecting, programming, and reading a programmed state of an individual cell. The device preferably further includes a first potential reference, a second potential reference higher than the first, a third potential reference higher than the second, and a generator of negative voltage with respect to the potential of the first reference. The device preferably further includes connecting and switching circuit means whereby the first and second terminals of each cell selected for programming are connected to the first and second potential references, respectively, and whereby the control terminal of each cell selected for programming is respectively connected to the third potential reference, during a write step, and to the negative voltage generator during an erase step.

BRIEF DESCRIPTION OF THE DRAWINGS

The features and advantages of a device with non-volatile memory cells according to the invention will be apparent from the following description of an embodiment thereof, given by way of example and not of limitation with reference to the accompanying drawings.

In the drawings.

DETAILED DESCRIPTION OF PREFERRED EMBODIMENTS

Figure 1:
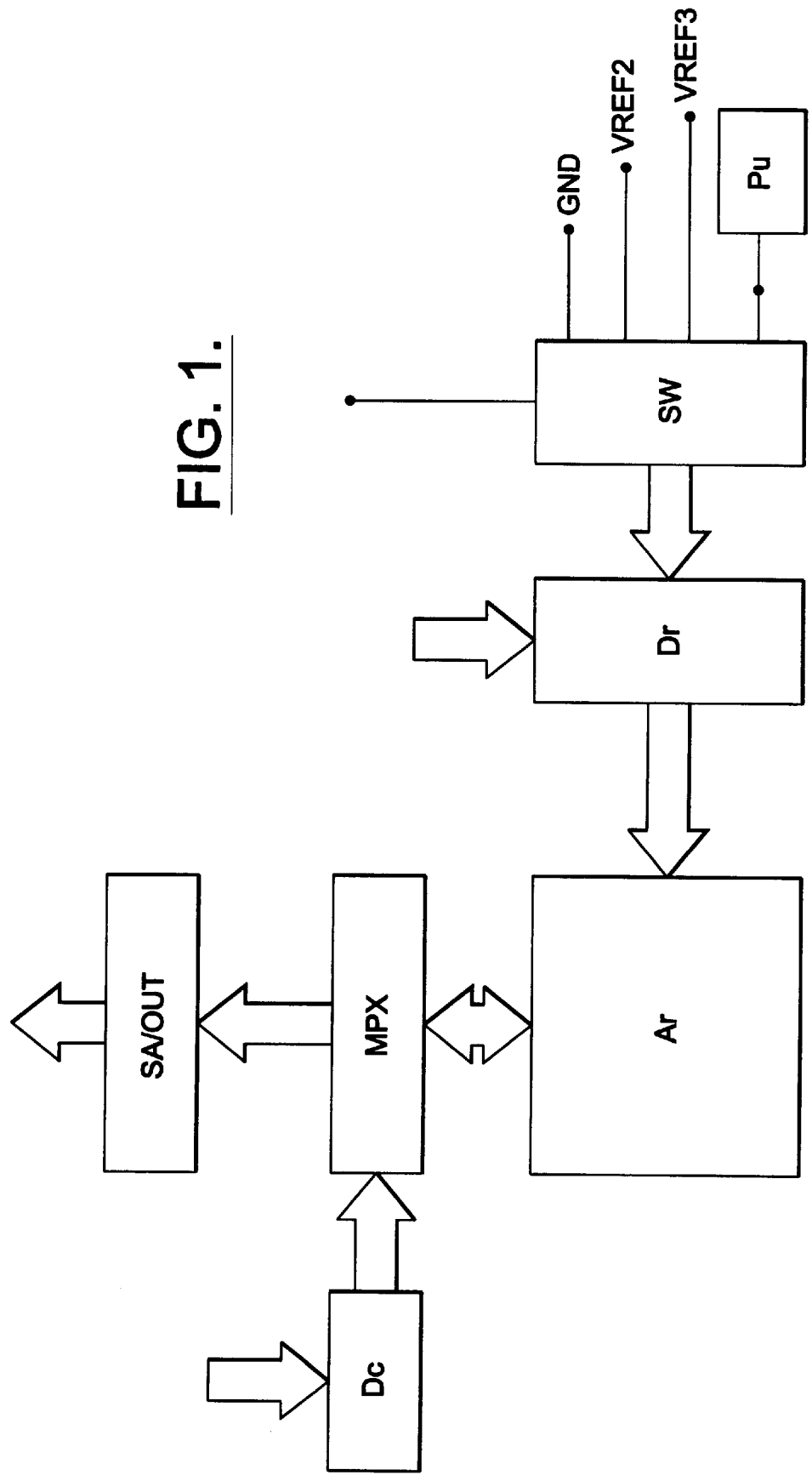
FIG. 1 is a block diagram of a device with non-volatile memory cells according to the invention.

Shown in block diagram form in FIG. 1 are the essential parts of a device with non-volatile memory cells according to the invention. The memory cells are electrically interconnected into a matrix-like configuration Ar of cell rows and columns. The cells are selected through row-decoding circuit means Dr and column-decoding circuit means Dc. The last-named means act on an interface circuit MPX (multiplexer) connected between data detection and output means SA. The decoding circuit means, interface circuit, and detection and output means cain be realized in known manners as would be readily appreciated by those skilled in the art.

Figure 2:
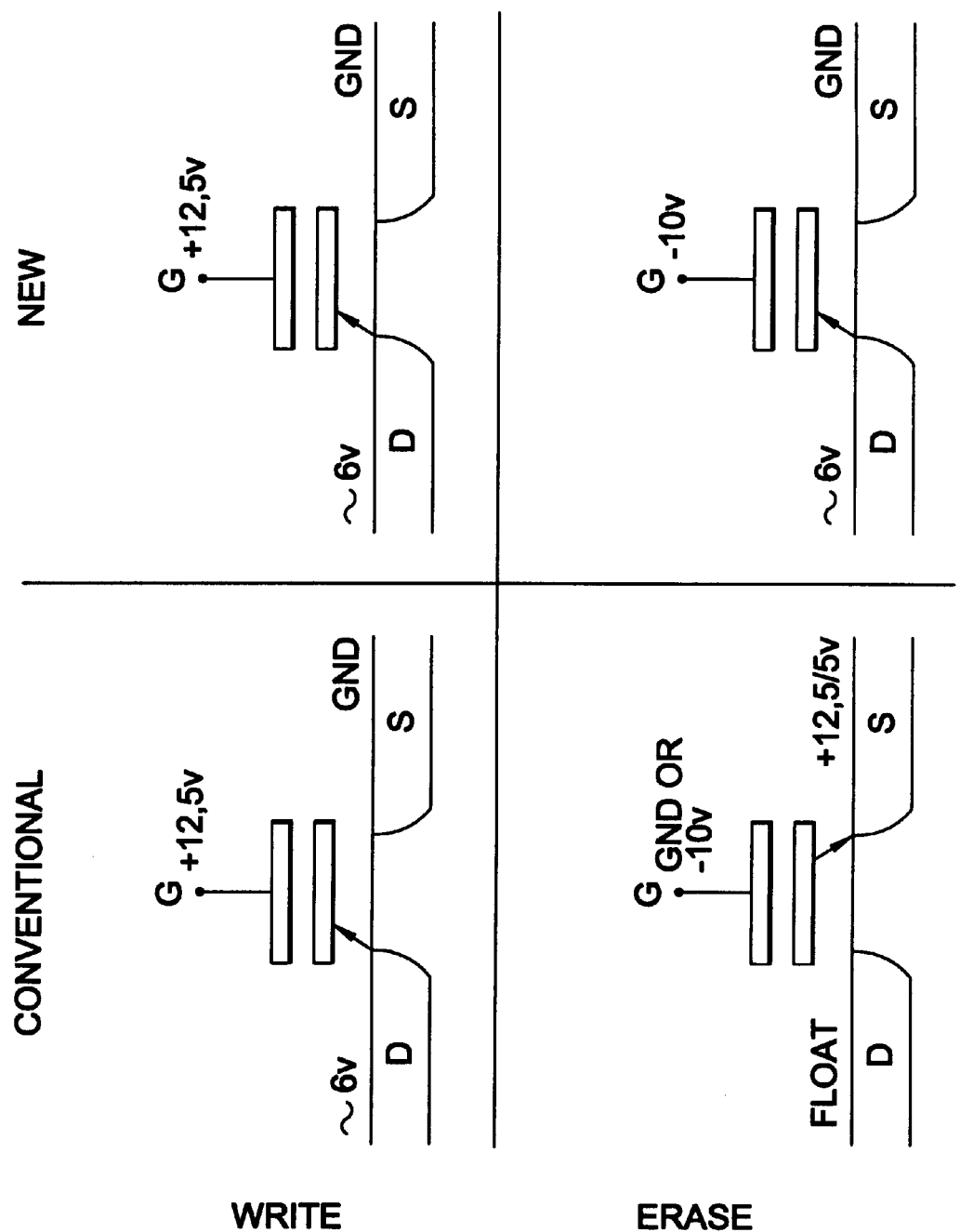
FIG. 2 shows schematically a comparison of a possible bias condition of a memory cell in the inventive device with the normal bias condition of a memory cell in a conventional flash device.

Novel is instead the architecture interlinking the memory cells which provides them, as shown in FIG. 2, with a different bias condition to that commonly used for conventional flash devices. It being understood that the word programming encompasses here both the erase and the write step, independently of data reading and of the implementation of control algorithms for various operations. The source and drain terminals of each cell selected for programming are connected, through connecting/switching circuit means SW, to a ground potential reference GND and a second potential reference VREF2, typically of about +6V, respectively According to the invention, and as shown in FIG. 2, the memory cells are, unlike conventional devices, similarly biased in the source/drain respect during both the erase and write steps. The gate terminal of each cell selected for programming is respectively connected, via said connecting/switching circuit means SW, to a third potential reference VREF3, typically of +12.5V, during the write step, and to a negative charge pump or generator of a negative potential, typically of –10V, relative to the ground potential during the erase step. These bias conditions of the individual cells may result in such advantageous differences over the prior art, in the matter of connections within the memory cell matrix, as can be optimized by the person of ordinary skill.

An arrow symbol in FIG. 2 highlights that, unlike conventional flash devices, the invention provides for operation based on alternating charge flows between the gate dielectric and the drain, and vice versa; rather, than for operation based on alternating charge flows between the gate dielectric and the source, and between the drain and the gate dielectric. For reliability reasons, the useful number of programming cycles is greatly reduced, but where a large number of cycles would otherwise be wasteful, far lower costs can be achieved along with benefits from the standpoints of the device architecture and operation.

For instance, by only using the drain terminal for erasing, both the logic circuit portion and the large size transistor can be omitted. These are necessary in a conventional device for switching a high voltage to the source capacitance, itself quite high, of the cell matrix.

It also becomes possible to separate in operation different sections of the matrix without redoubling the metallizations of the column bit lines, thereby saving process steps in the device integration. Another technical, and hence economical, advantage is that by providing for few programming cycles since the designing stage, the oxide thicknesses need not be differentiated, which brings about additional savings in process steps. For a given operational capacity, a device according to the invention may require as much as 15 to 20% less integration area than a conventional device.

The read procedure is quite conventional and facilitated by determining a control algorithm for the distribution of an acceptable threshold voltage after the erase step. Also conventional is the write procedure, which impresses a high voltage of about +12V on the selected rows of the cell matrix and a medium voltage of about +6V on the selected columns of the matrix. The unselected word lines, or row lines, remain at ground potential, and the unselected column lines are left to float.

Novel is the erase operation, whereby all the row lines of the memory cell matrix are brought to a negative potential of about −10V, as by means of the charge pump, while a voltage of about −6V remains applied to the selected columns. By using several negative charge pumps, just predetermined portions of the cell matrix can be selected for th(e erase operation.

It is understood that modifications or integrations may be made unto the foregoing embodiment without departing from the protection scope of the following claims.

We claim:

1. A monolithically integrated device comprising:
   electrically programmable non-volatile memory cells forming a cell matrix having rows and columns, each having at least a source and a drain and a gate which are used for selecting, programming, and reading a programmed state of an individual cell;
   a first potential reference, a second potential reference higher than the first, a third potential reference higher than the second, and a generator of negative voltage with respect to the potential of the first reference wherein the first potential reference is ground; and
   connecting and switching circuit means for connecting the source and drain of each cell selected for programming to the first and second potential references to allow a charge flow between a gate and drain, respectively, during write and erase steps such that during the write and erase steps, the source and drain of each cell are always connected to the same potential reference so that the write and erase steps are both performed between the gate and drain based on alternating charge flows between the gate and drain, and for connecting the control terminal of each cell selected for programming to the third potential reference, during a write step, and to the negative voltage generator during an erase step, wherein during the write step, a high positive voltage is impressed on selected rows of the cell matrix and a medium positive voltage is impressed on selected columns of the matrix.

2. The device according to claim 1, wherein the third potential reference is about positive 12.5 volts during the write step, and the negative charge pump typically about negative 10 volts.

3. The device according to claim 1, wherein during the write step, the positive voltage of about 12 volts is placed on the selected rows of the cell matrix and the medium positive step of about 6 volts is placed on the selected columns of the matrix.

4. A monolithically integrated device comprising:
   electrically programmable non-volatile memory cells forming a cell matrix having rows and columns, each cell having first and second terminals and a control terminal utilized for selecting, programming, and reading the programmed state of an individual cell,
   row decoding circuit means and column decoding circuit means for interconnecting said electrically programmable non-volatile memory cells into a matrix configuration of selectable rows and columns;
   a data detection and output circuit;
   an interface circuit multiplexer connected to said column decoding circuit means and data detection and output circuit and connected to said cell matrix;
   a first potential reference, a second potential reference higher than the first, a third potential reference higher than the second, and a generator of negative voltage with respect to the potential of the first reference, wherein the first and second terminals and the control terminal of each electrically programmable memory cell are a source, a drain, and a gate terminal respectively and the first potential reference is ground;
   connecting and switching circuit means for connecting the first and second terminals of each cell selected for programming to the first and second potential references to allow a charge flow between a gate dielectric and drain, respectively, during write and erase steps such that during the write and erase steps, the first and second terminals of each cell are always connected to the same potential reference so that the write and erase steps are both performed between the same terminals based on alternating charge flows, and connecting the control terminal of each cell selected for programming to the third potential reference, during a write step, and to the negative voltage generator during an erase step, wherein during the write step, a high positive voltage is impressed on selected rows of the cell matrix and a medium positive voltage is impressed on selected columns of the matrix.

5. The device according to claim 4, wherein the third potential reference is about positive 12.5 volts during the write step, and the negative charge pump is typically about negative 10 volts.

6. The device according to claim 4, wherein during the write step, the positive voltage of about 12 volts is placed on the selected rows of the cell matrix and the medium positive step of about 6 volts is placed on the selected columns of the matrix.

7. An electronic apparatus comprising:
   a programmable non-volatile memory comprising at least one monolithically integrated device, said at least monolithically integrated device comprising:
   electrically programmable non-volatile memory cells forming a cell matrix having rows and columns, each having at least first and second terminals and a control terminal which are used for selecting, programming, and reading a programmed state of an individual cell;

a data detection and output circuit;

an interface circuit multiplexer connected to said column decoding circuit means and data detection and output circuit and connected to said cell matrix;

a first potential reference, a second potential reference higher than the first, a third potential reference higher than the second, and a generator of negative voltage with respect to the potential of the first reference, wherein the first and second terminals and the control terminal of each electrically programmable memory cell are a source, a drain, and a gate terminal respectively and the first potential reference is ground; and connecting and switching circuit means for connecting the first and second terminals of each cell selected for programming to the first and second potential references to allow a charge flow between a gate dielectric and drain, respectively, during write and erase steps such that during the write and erase steps, the first and second terminals of each cell are always connected to the same potential reference, so that the write and erase steps are both performed between the same terminals based on alternating charge flows, and connecting the control terminal of each cell selected for programming to the third potential reference, during a write step, and to the negative voltage generator during an erase step, wherein during the write step, a high positive voltage is impressed on selected rows of the cell matrix and a medium positive voltage is impressed on selected columns of the matrix.

8. The electronic apparatus according to claim 7 further comprising row decoding circuit means and column decoding circuit means for interconnecting said electrically programmable non-volatile memory cells into a matrix configuration of selectable rows and columns.

9. The device according to claim 7, wherein the third potential reference is about positive 12.5 volts during the write step, and the negative charge pump is typically about negative 10 volts.

10. The device according to claim 7, wherein during the write step, the positive voltage of about 12 volts is placed on the selected rows of the cell matrix and the medium positive step of about 6 volts is placed on the selected columns of the matrix.

11. A monolithically integrated device comprising:

electrically programmable non-volatile memory cells, each having at least a source, a drain and gate which are used for selecting, programming, and reading a programmed state of an individual cell;

a first potential reference, a second potential reference higher than the first, a third potential reference higher than the second, and a generator of negative voltage with respect to the potential of the first reference, wherein, the first potential reference is ground; and connecting and switching circuit means for connecting the first and second terminals of each cell selected for programming to the first and second potential references to allow a charge flow between a gate and drain, respectively, during write and erase steps, such that during the write and erase steps, the source and drain of each cell are always connected to the same potential reference so that the write and erase steps are both performed between the gate and drain based on alternating charge flows between the gate and drain, and for connecting the control terminal of each cell selected for programming to the third potential reference, during a write step, and to the negative voltage generator during an erase step.

* * * * *

UNITED STATES PATENT AND TRADEMARK OFFICE
CERTIFICATE OF CORRECTION

PATENT NO. : 5,926,416
DATED : July 20, 1999
INVENTOR(S) : Beverina et al

It is certified that error appears in the above-identified patent and that said Letters Patent is hereby corrected as shown below:

Title Page, Item 30:   Foreign Application Priority Data:

delete: "9680088"

substitute: -- 96830088 --

Column 2, line 33   delete the word: "cain"

substitute the word: -- can --

Column 3, line 35   delete: "can be selected for th(e--.

substitute: -- can be selected for the --

Signed and Sealed this

Seventh Day of December, 1999

Attest:

Q. TODD DICKINSON

*Attesting Officer*   *Acting Commissioner of Patents and Trademarks*